United States Patent
Wu

(10) Patent No.: US 6,756,631 B2
(45) Date of Patent: Jun. 29, 2004

(54) STACKED-GATE CELL STRUCTURE AND ITS NAND-TYPE FLASH MEMORY ARRAY

(75) Inventor: Ching-Yuan Wu, Hsinchu (TW)

(73) Assignee: Intelligent Sources Development Corp., Hsinchu (TW)

(*) Notice: Subject to any disclaimer, the term of this patent is extended or adjusted under 35 U.S.C. 154(b) by 0 days.

(21) Appl. No.: 10/298,125

(22) Filed: Nov. 14, 2002

(65) Prior Publication Data

US 2004/0094794 A1 May 20, 2004

(51) Int. Cl.[7] .............................................. H01L 29/788
(52) U.S. Cl. ........................ 257/316; 257/317; 257/319; 257/320; 257/321
(58) Field of Search ................................ 257/315–317, 257/319–321

(56) References Cited

U.S. PATENT DOCUMENTS 6,465,837 B1 * 10/2002 Wu ............................. 257/315

* cited by examiner

*Primary Examiner*—Thien F Tran
(74) *Attorney, Agent, or Firm*—Pro-Techtor International Services

(57) ABSTRACT

A stacked-gate cell structure having a tapered floating-gate layer and a laterally graded source/drain diffusion profile is implemented to form NAND cell strings over a self-aligned STI structure having a high coupling ratio. The paired string select lines and the paired ground select lines being formed over one-side tapered floating-gate layers are simultaneously defined by a spacer formation technique and are therefore scalable. Each of common-source conductive bus lines is formed over a first flat bed between a pair of sidewall dielectric spacers being formed over sidewalls of the paired ground select lines. A plurality of planarized common-drain conductive islands are formed over common-drain diffusion regions between another pair of sidewall dielectric spacers being formed over sidewalls of the paired string select lines and are patterned simultaneously with a plurality of metal bit-lines by using a masking photoresist step.

13 Claims, 10 Drawing Sheets

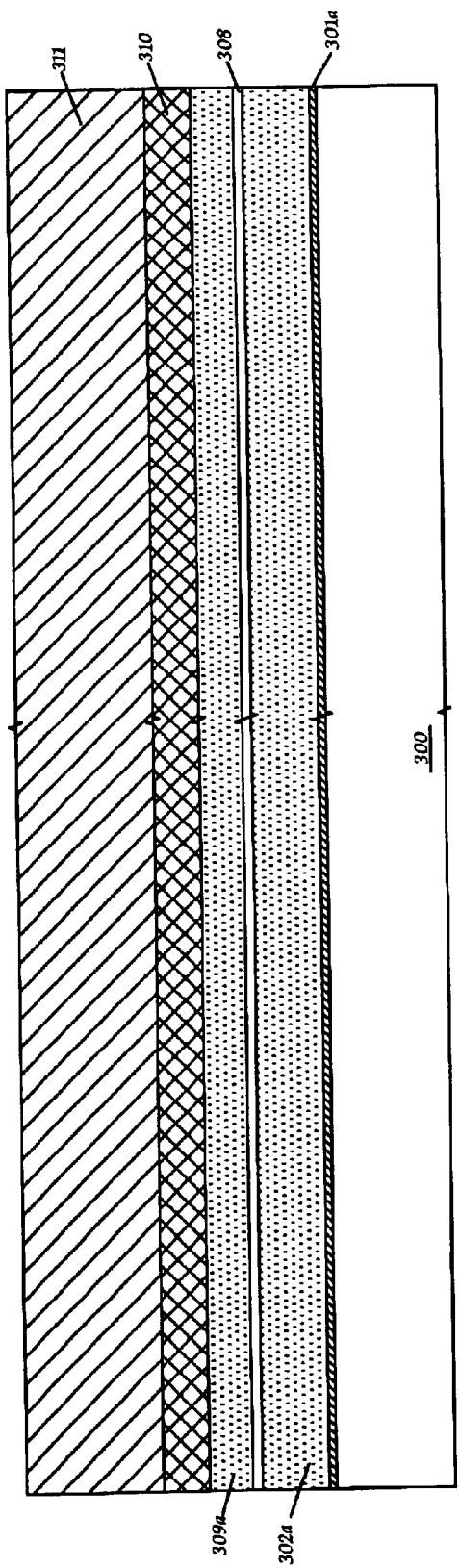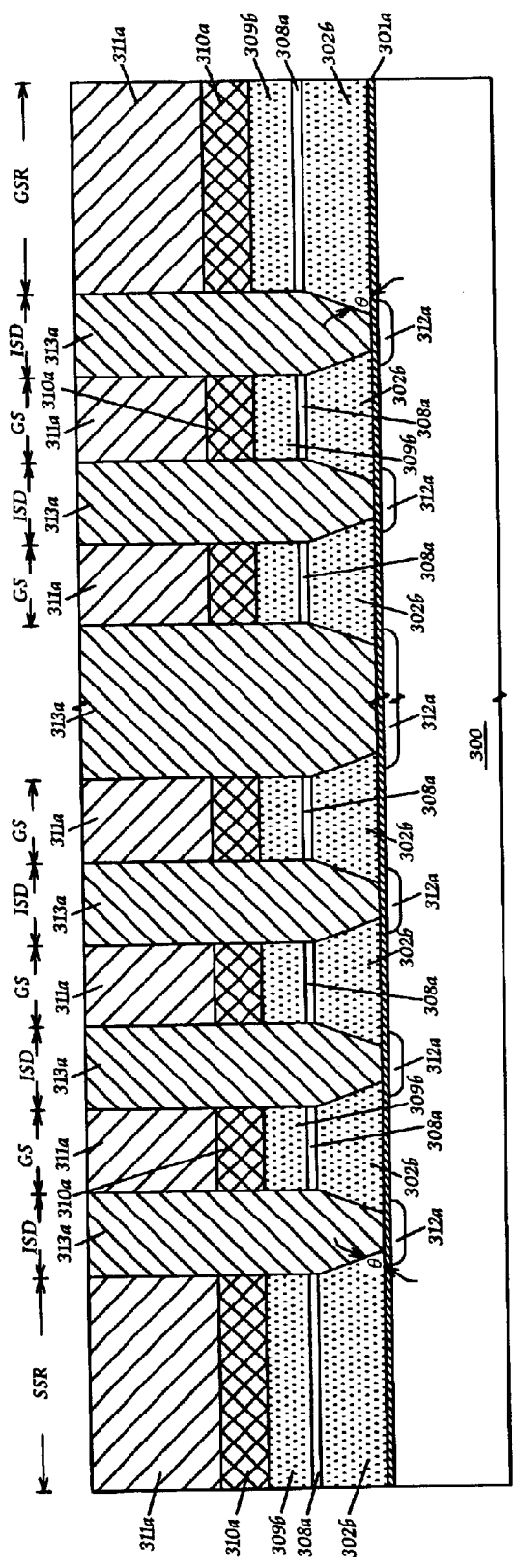

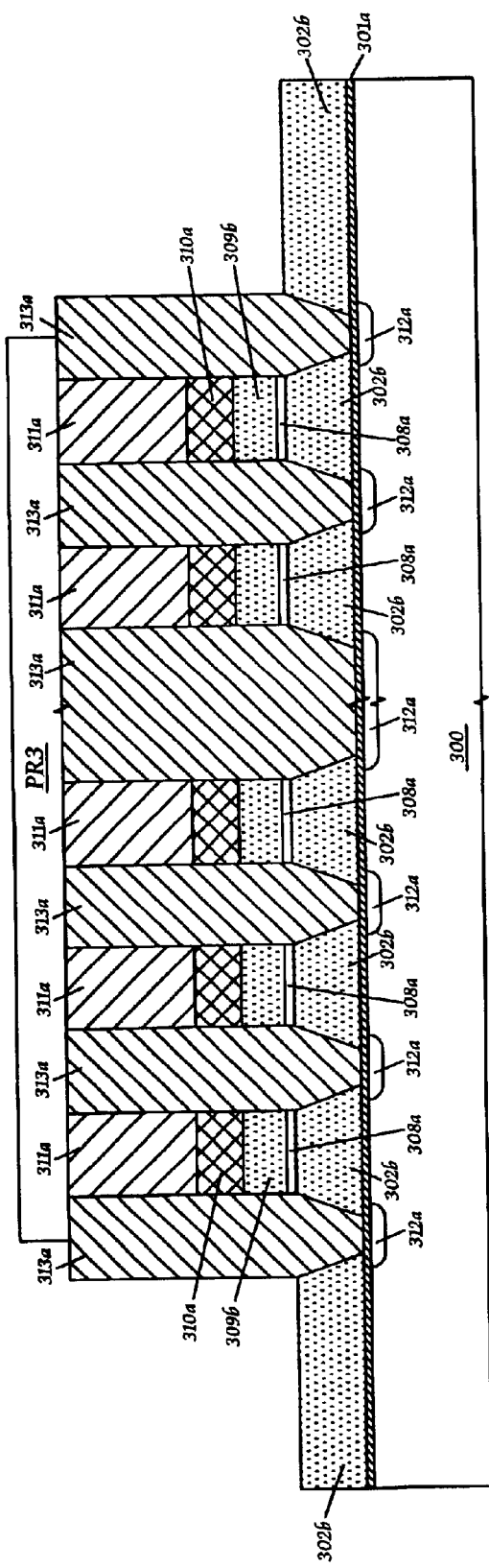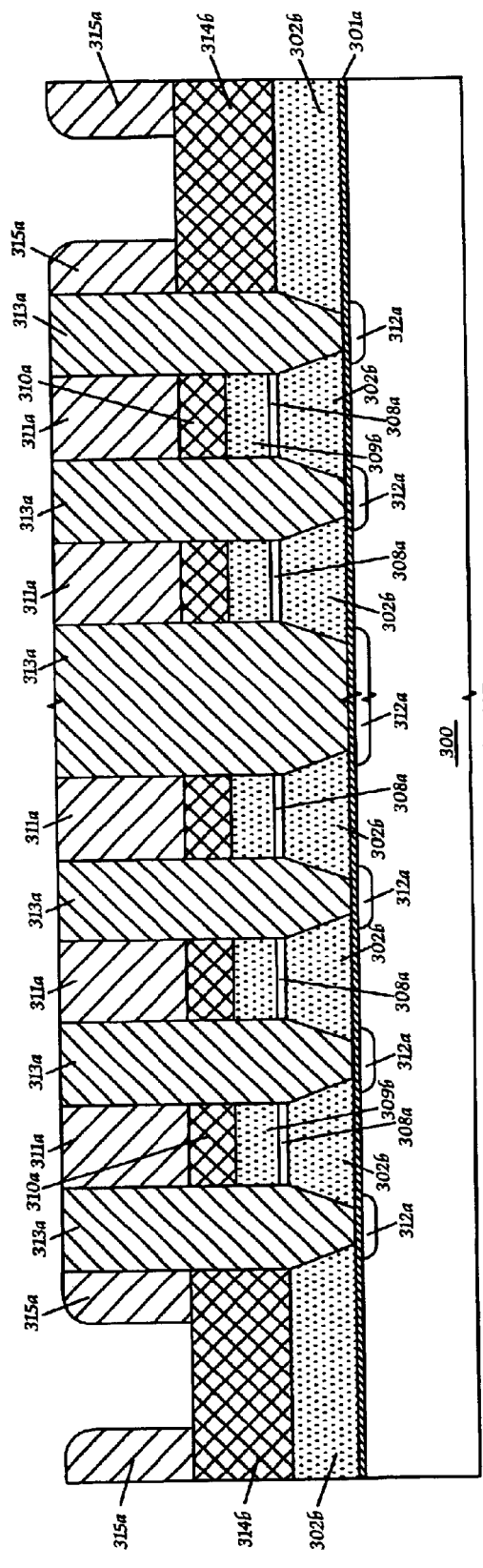

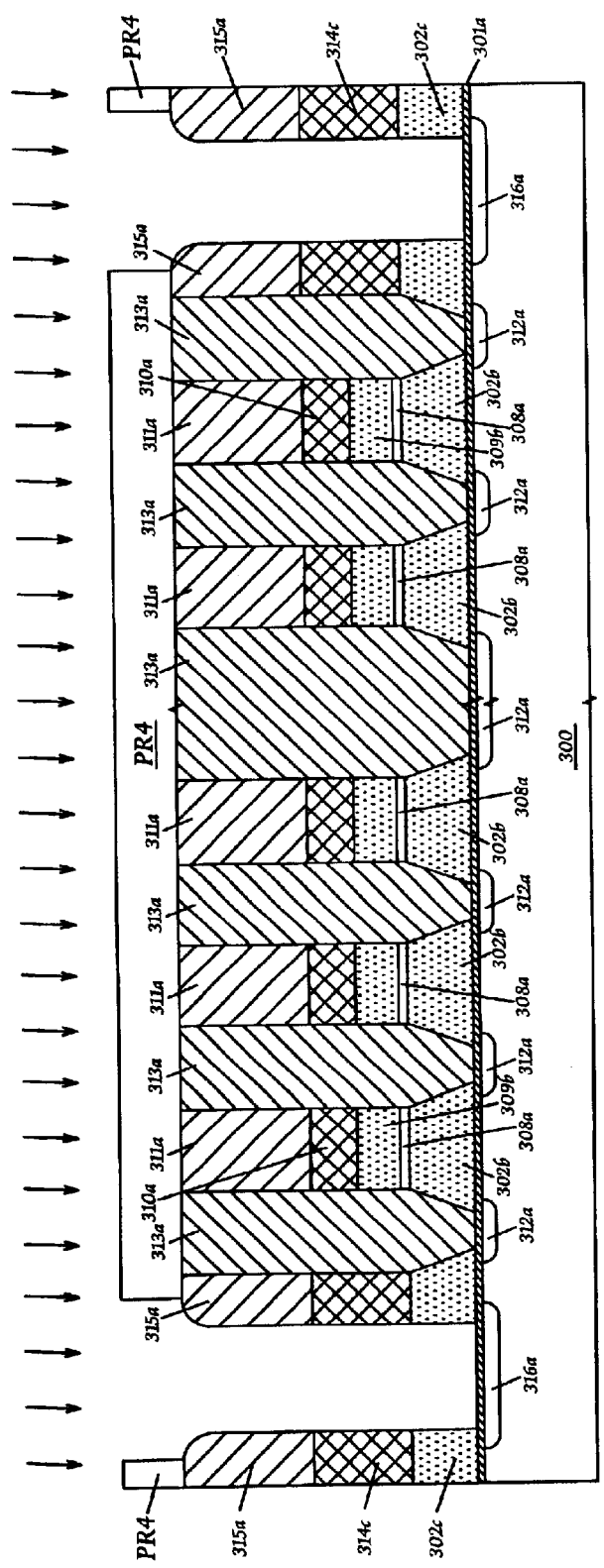
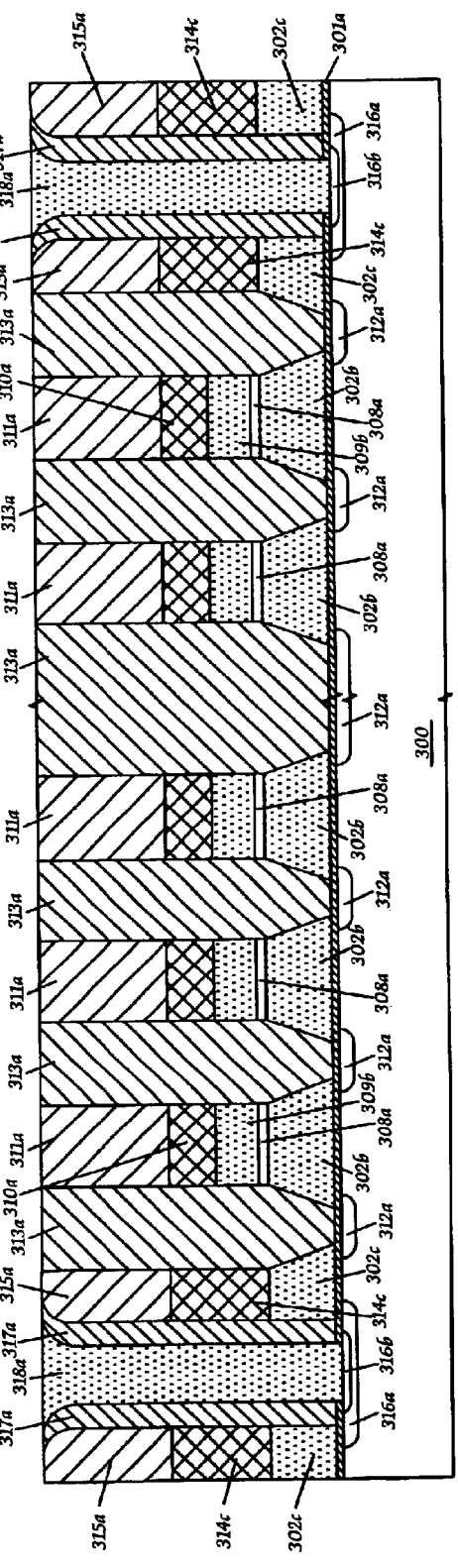
FIG. 4E
FIG. 4F

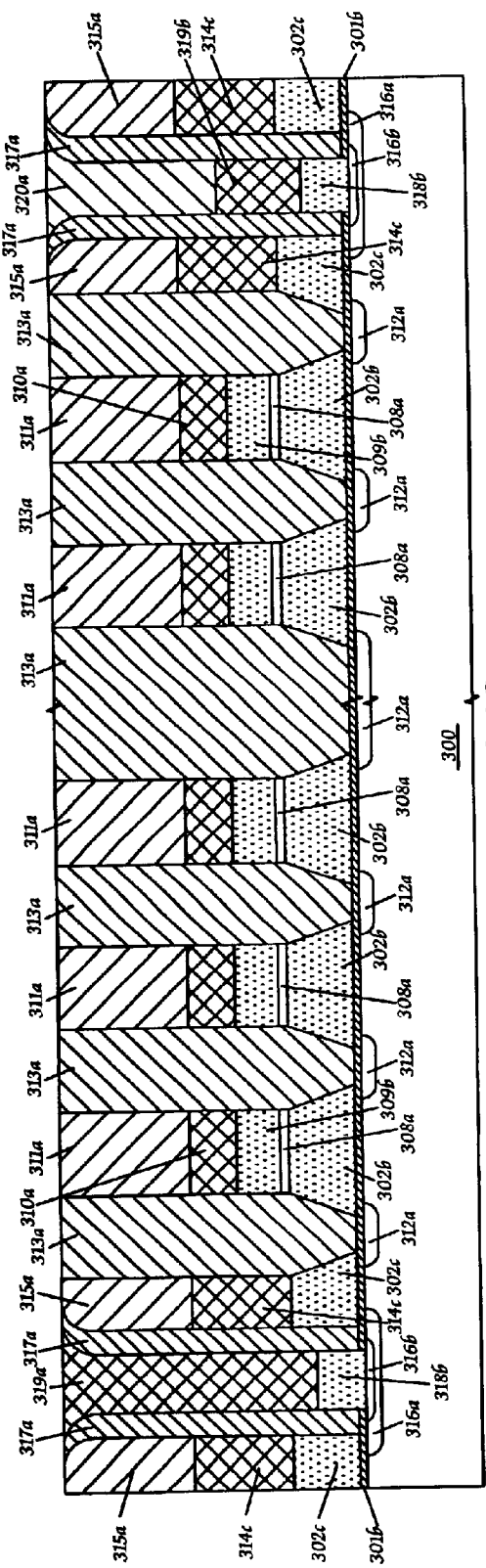
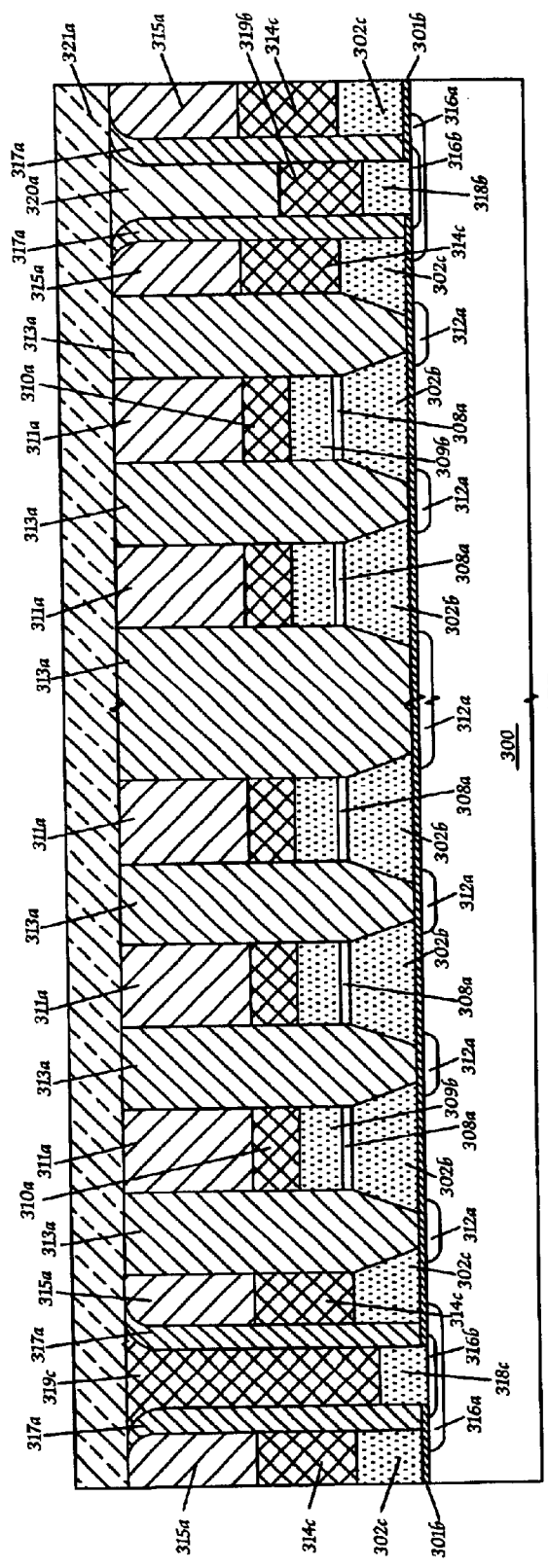

STACKED-GATE CELL STRUCTURE AND ITS NAND-TYPE FLASH MEMORY ARRAY

BACKGROUND OF THE INVENTION

1. Field of the Invention

The present invention relates generally to a non-volatile semiconductor memory device and its memory array and, more particularly, to method of forming a stacked-gate cell structure and its NAND-type flash memory array.

2. Description of Related Art

A stacked-gate cell structure is one of the basic non-volatile semiconductor memory structure for forming a high-density flash memory array. In general, a stacked-gate cell can be programmed by channel hot-electron injection (CHEI) mechanism through a high drain field near a drain edge and can be erased by Fowler-Nordheim (FN) tunneling mechanism through an overlapping region between the floating-gate and the common-source diffusion region or between the floating-gate and the semiconductor substrate. In general, the programming power is high and the programming efficiency is low for channel hot-electron injection mechanism and the stacked-gate length is difficult to be scaled due to the punch-through effect. The stacked-gate cell structure with the channel hot-electron injection mechanism as a programming method is often implemented as a NOR-type flash memory array.

The stacked-gate cell structure can be programmed and erased by Fowler-Nordheim tunneling mechanism to obtain low power programming and erasing between the floating-gate and the semiconductor substrate. A cross-sectional view of a conventional stacked-gate cell structure in a NAND-type array is shown in FIG. 1, in which FIG. 1A shows the stacked-gate cell structure in a programming state and FIG. 1B shows the stacked-gate cell structure in an erasing state. From FIG. 1A and FIG. 1B, a gate stack comprising from top to bottom a tungsten-disilicide layer 105, a doped polycrystalline-silicon layer 104, an intergate-dielectric layer 103, a doped polycrystalline-silicon layer 102, and a tunneling-oxide layer 101 is patterned in general with a minimum feature size (F) of technology used and is fabricated on a p-well 100b formed within an n-well 100a; and symmetrical common-source/drain $n^+$ diffusion regions 106a/106b are formed in a self-aligned manner by implanting a high dose of doping impurities into the p-well 100b by using the gate stack as an implantation mask. From FIG. 1A, as the control-gate 105, 104 is applied with a high positive gate voltage (for example +18V), the source/drain $n^+$ diffusion regions 106a/106b, the p-well 100b, and the n-well 100a are grounded, electrons in the induced surface inversion layer and the source/drain $n^+$ diffusion regions 106a/106b under the tunneling-oxide layer 101 may tunnel across the tunneling-oxide layer 101 into the floating-gate layer 102 for performing a programming operation. From FIG. 1B, the control-gate 105, 104 is grounded, the p-well 100b and the n-well 100a are applied with a high positive voltage (for example +20V), and the source/drain $n^+$ diffusion regions 106a, 106b are floating, electrons stored in the floating-gate layer 102 may tunnel across the tunneling-oxide layer 101 into the p-well 100b for performing an erasing operation. It is clearly seen that as the gate length of the stacked-gate cell structure shown in FIG. 1A and FIG. 1B is scaled, the effective area for programming and erasing will be drastically reduced and the programming and erasing speed will be reduced accordingly. Moreover, the applied control-gate voltage for programming and the applied p-well and n-well voltage for erasing are relatively high, and therefore, a floating-gate structure having a high coupling ratio is needed in order to reduce the applied control-gate voltage for programming and the applied p-well and n-well voltage for erasing. A typical example for forming a shallow trench isolation (STI) structure having a non-self-aligned floating-gate layer with a high coupling ratio can be fabricated by two critical masking steps to form a self-aligned STI structure and at least four critical masking steps are needed to form a NAND flash memory array over the self-aligned STI structure.

It is, therefore, a major objective of the present invention to offer a stacked-gate cell structure having a tapered floating-gate structure for a NAND-type flash memory array with larger programming and erasing area as the stacked-gate length is scaled.

It is another objective of the present invention to offer a self-aligned floating-gate structure having a high coupling ratio.

It is a further objective of the present invention to offer method of forming a contactless NAND-type flash memory array with less critical masking steps and smaller unit cell size.

SUMMARY OF THE INVENTION

A stacked-gate cell structure having a tapered floating-gate layer is used to implement a contactless NAND-type flash memory array of the present invention, in which the tapered floating-gate layer not only offers a larger surface area over the tunneling-dielectric layer for programming and erasing without enlarging the control-gate length but also provides the tapered tips to increase the erasing speed. The contactless NAND-type flash memory array of the present invention is fabricated on a shallow-trench-isolation (STI) structure having a self-aligned floating-gate structure, wherein the self-aligned floating-gate structure of the present invention offers a larger coupling ratio with less critical masking steps and a smoothed surface for forming an intergate-dielectric layer in order to alleviate the field emission effect due to the sharp corners of the prior art. The width of the string select lines and the ground select lines of a NAND-type array being defined by a spacer formation technique can be made to be smaller than a minimum feature size of technology used. The conductive gate of the select-gate transistors in each of the string/ground select lines is made to have a one-side tapered floating-gate structure and, therefore, can offer a longer channel length as compared to the width of the string/ground select lines. Each of the common-source conductive bus lines is formed over a first flat bed being alternately formed by a common-source diffusion region and a third raised field-oxide layer, and a lower bus-line resistance and a lower bus-line capacitance with respect to the semiconductor substrate can be easily obtained. Each of the bit-line contacts being formed by a planarized common-drain conductive island is simultaneously patterned with a metal bit-line, so a larger contact area and a higher contact integrity for a scaled contact technology can be easily obtained. The contactless NAND-type flash memory array of the present invention can be fabricated with less critical masking photoresist steps and smaller unit cell size as compared to the prior art.

BRIEF DESCRIPTION OF THE DRAWINGS

FIG. 1A and FIG. 1B show a cross-sectional view of a conventional stacked-gate flash cell structure in a NAND-type flash memory array and its schematic diagram for programming and erasing, in which FIG. 1A shows a programming state and FIG. 1B shows an erasing state.

FIG. 2A and FIG. 2B show a cross-sectional view of a stacked-gate flash cell of the present invention in a NAND-type memory array and its schematic diagram for programming and erasing, in which FIG. 1A shows a programming state and FIG. 1B shows an erasing state.

FIG. 4A through FIG. 4H show the process steps and their cross-sectional views for forming a NAND-type flash memory array of the present invention after FIG. 3F.

FIG. 5A through FIG. 5E show a schematic top plan view and its cross-sectional views of the present invention, in which FIG. 5A shows a schematic top plan view of FIG. 4H; FIG. 5B shows a cross-sectional view along a B–B' line shown in FIG. 5A; FIG. 5C shows a cross-sectional view along a C–C' line shown in FIG. 5A; FIG. 5D shows a cross-sectional view along a D–D' line shown in FIG. 5A; and FIG. 5E shows a cross-sectional view along a E–E' line shown in FIG. 5A.

DETAILED DESCRIPTION OF THE PREFERRED EMBODIMENTS

Figure 1A:
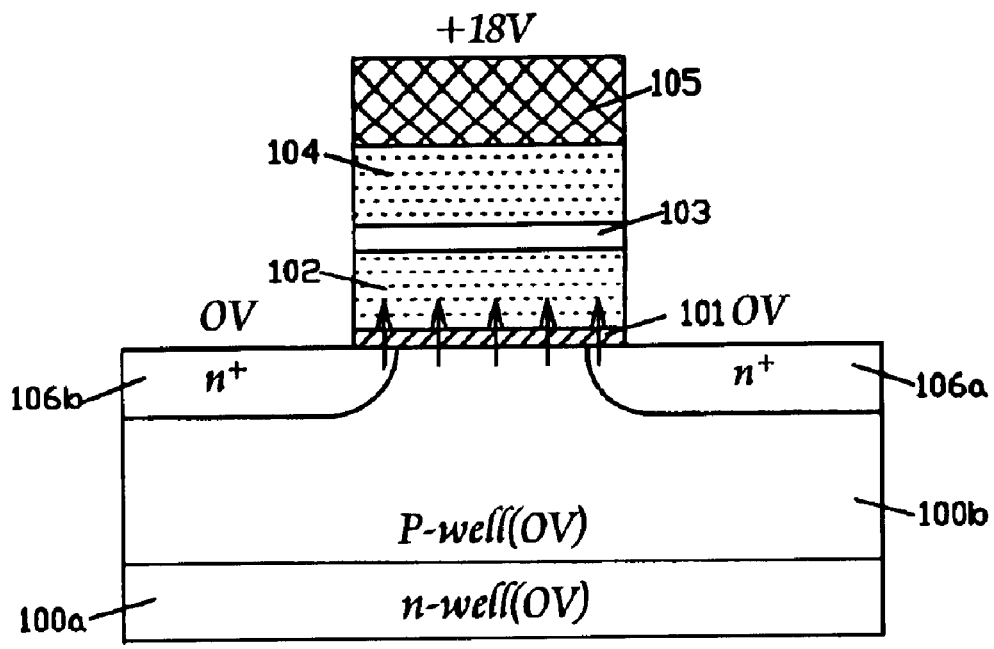
Figure 1B:
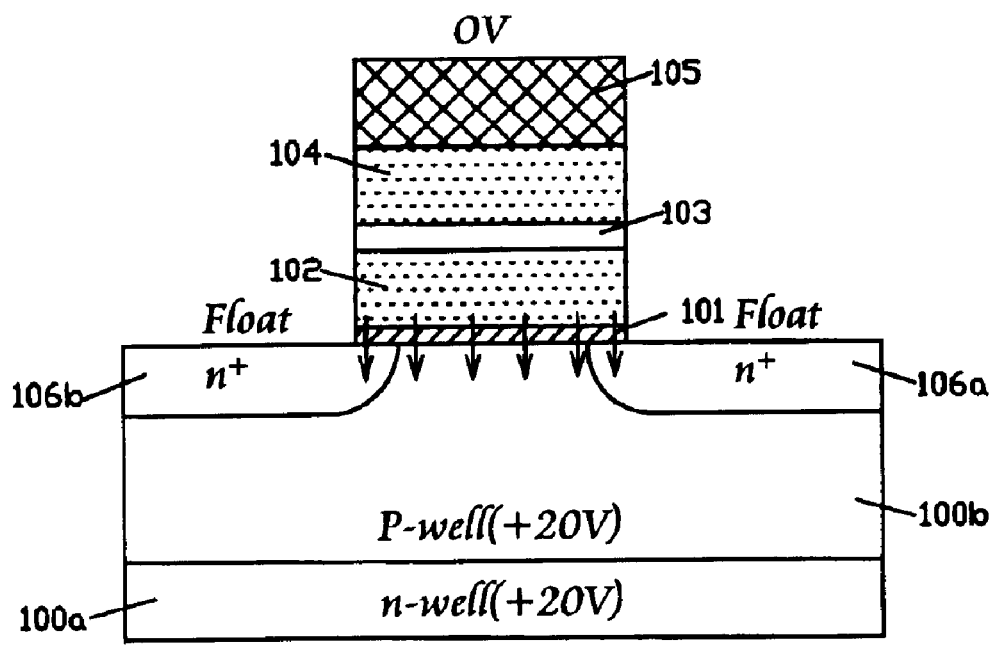
Figure 2A:
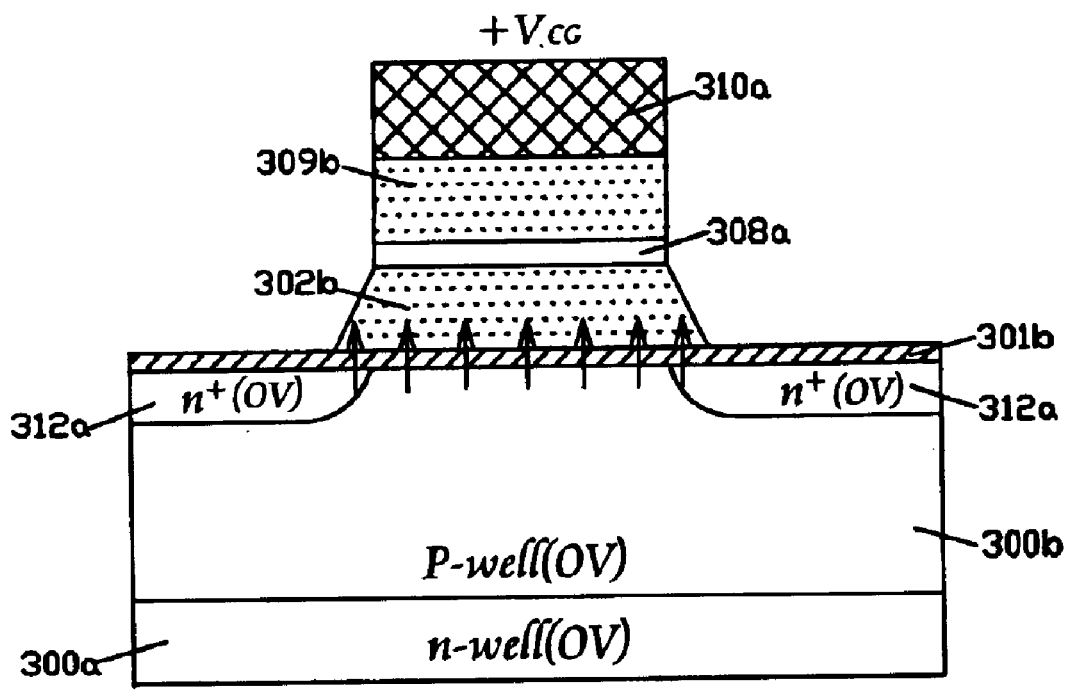
Figure 2B:
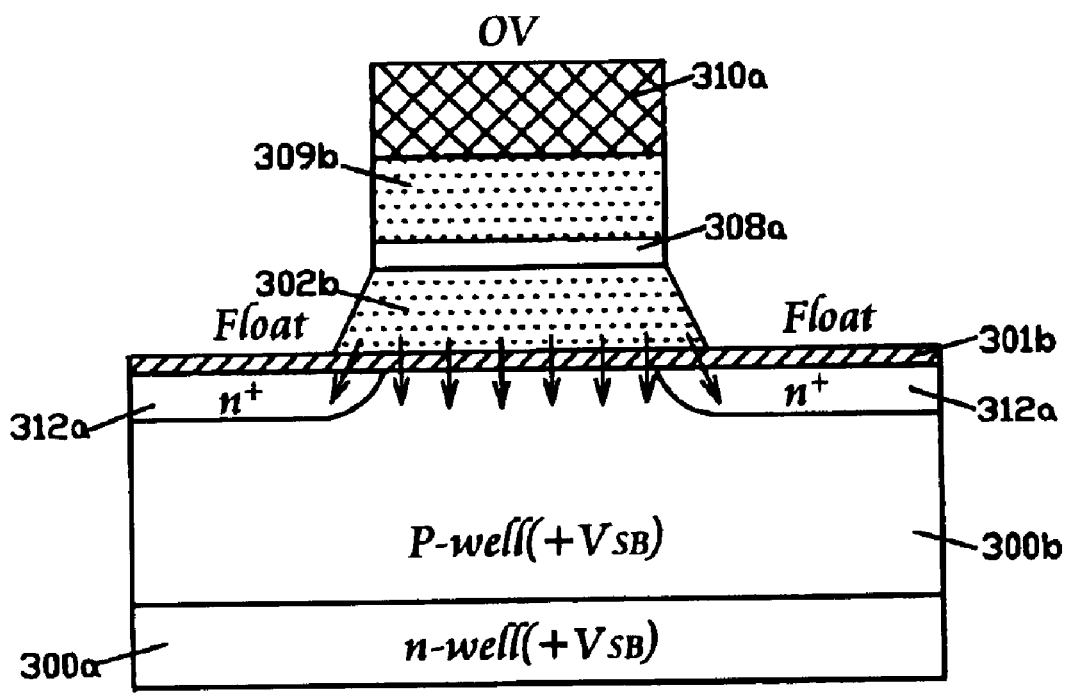

Referring now to FIG. 2A and FIG. 2B, there are shown a stacked-gate cell structure of the present invention being operated in a programming state as shown in FIG. 2A and in an erasing state as shown in FIG. 2B. The stacked-gate cell structure of the present invention comprises from top to bottom a composite control-gate layer 310a/309b, an intergate-dielectric layer 308a, a tapered floating-gate layer 302b, and a tunneling-dielectric layer 301b being formed over a p-well 300b formed within an n-well 300a; common-source and drain diffusion regions 312a being formed with a laterally graded doping profile by implanting a high dose of doping impurities across the tapered portions of the tapered floating-gate layer 302b and the tunneling-dielectric layer 301b into the p-well 300b in a self-aligned manner. Apparently, the stacked-gate cell structure of the present invention may offer a larger surface area facing the tunneling-dielectric layer 301b for a given control-gate length as compared to the prior art shown in FIG. 1A and FIG. 1B. For the programming state as shown in FIG. 2A, the common-source and drain diffusion regions 312a and the semiconductor substrate 300 (p-well 300b and n-well 300a) are grounded, the composite control-gate layer 310a/309b is applied with a high positive voltage $V_{CG}$, electrons may tunnel from the common-source/drain diffusion regions 312a and the surface inversion layer formed in the p-well 300b into the tapered floating-gate layer 302b as indicated by the arrow symbols. For the erasing state as shown FIG. 2B, the composite control-gate layer 310a/309b is grounded, the common-source/ drain. diffusion regions 312a are floating, the semiconductor substrate 300 (p-well 300b and n-well 300a) is applied with a high positive voltage $V_{SB}$, electrons stored in the tapered floating-gate layer 302b may tunnel across the tunneling-dielectric layer 301b into the p-well 300b and the common-source/drain diffusion regions 312a. It is clearly seen that the erasing area shown in FIG. 2B is much larger than the prior art shown in FIG. 1B. Moreover, the sharp tips of the tapered floating-gate layer 302b may enhance the tunneling current in the erasing state. It will be shown later that a self-aligned floating-gate structure is formed in the gate-width direction to increase the coupling ratio of the tapered floating-gate layer 302b, the applied control-gate voltage $V_{CG}$ for the programming state and the applied substrate voltage VsB for the erasing state can be further reduced.

Referring now to FIG. 3A through FIG. 3F, there are shown the process steps and their cross-sectional views for forming a shallow trench isolation (STI) structure having a self-aligned floating-gate structure of a high coupling ratio for an advanced NAND-type array.

Figure 3A:
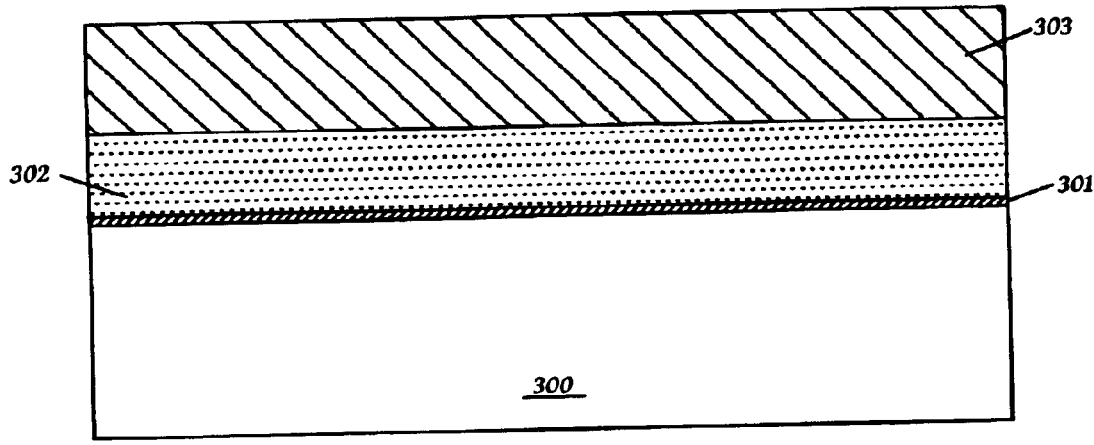
FIG. 3A through FIG. 3F show the process steps and their cross-sectional views of forming a shallow trench isolation structure having a self-aligned floating-gate structure for a NAND-type flash memory array.

FIG. 3A shows that a tunneling-dielectric layer 301 is formed on a semiconductor substrate 300 of a first conductivity type; a first conductive layer 302 is formed over the tunneling-dielectric layer 301; and a first masking dielectric layer 303 is formed over the first conductive layer 302. The tunneling-dielectric layer 301 is preferably a thermal silicon-dioxide layer or a nitrided thermal silicon-dioxide layer and its thickness is preferably between 60 Angstroms and 120 Angstroms. The first conductive layer 302 is preferably made of doped polycrystalline-silicon or doped amorphous-silicon as deposited by low pressure chemical vapor deposition (LPCVD) and its thickness is preferably between 1000 Angstroms and 5000 Angstroms. The first masking dielectric layer 303 is preferably made of silicon-nitride as deposited by LPCVD and its thickness is preferably between 1500 Angstroms and 3000 Angstroms.

Figure 3B:
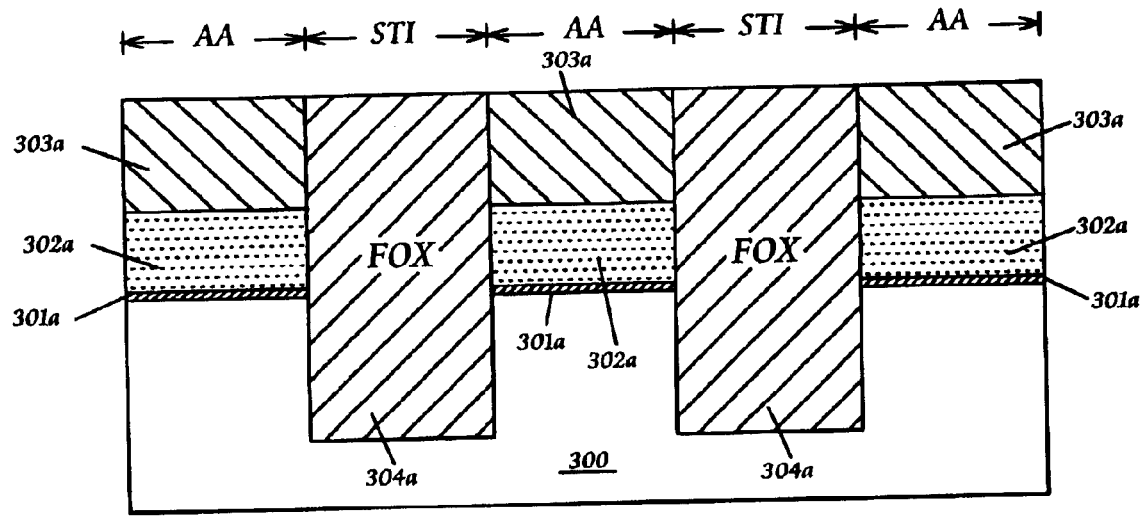

FIG. 3B shows a plurality of shallow trench isolation (STI) regions and a plurality of active regions (AA) are patterned alternately by a masking photoresist step PR1 (not shown) and a plurality of shallow trenches are then filled with planarized field-oxide layers 304a. The width of STI regions (STI) and the width of active regions (AA) can be defined to be a minimum feature size (F) of technology used. The planarized field-oxide layer 304a is preferably made of silicon-dioxide, phosphorous-silicate glass (p-glass), or borophosphorous-silicate glass (BP-glass) as deposited by LPCVD, high-density plasma (HDP) CVD, or plasma-enhanced (PE) CVD, and is formed by first depositing a thick oxide film 304 to fill up each gap formed by the shallow trenches and then planarizing the deposited thick oxide film 304 using chemical-mechanical polishing (CMP) with the patterned first masking dielectric layer 303a as a polishing stop. The depth of the shallow trenches in the semiconductor substrate 300 is preferably between 2500 Angstroms and 5000 Angstroms.

Figure 3C:
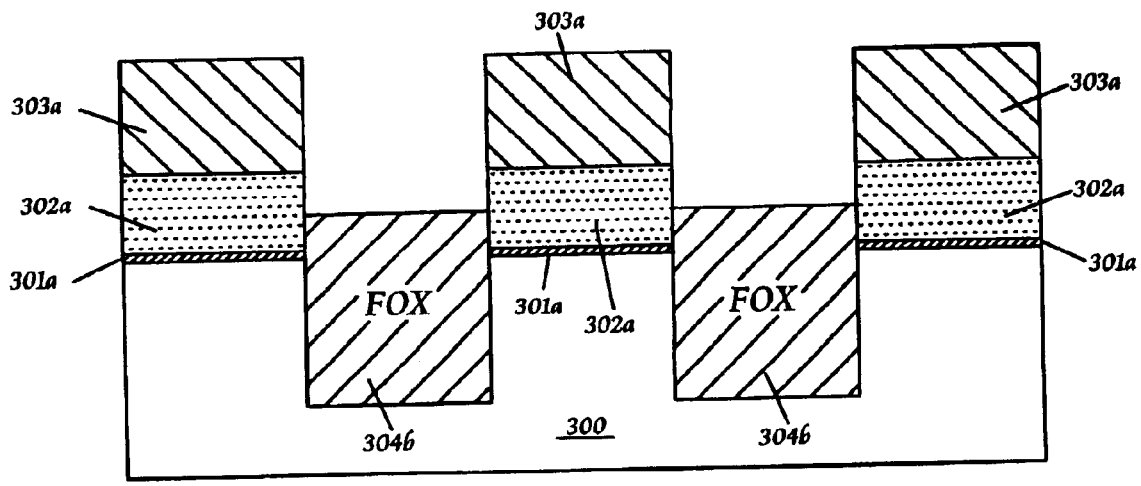

FIG. 3C shows that the planarized field-oxide layers 304a are selectively etched back to a level approximately equal to a half thickness of the patterned first conductive layer 302a by using anisotropic dry etching or wet-chemical etching with the patterned first masking dielectric layers 303a as the etching masks to form first raised field-oxide layers 304b.

Figure 3D:
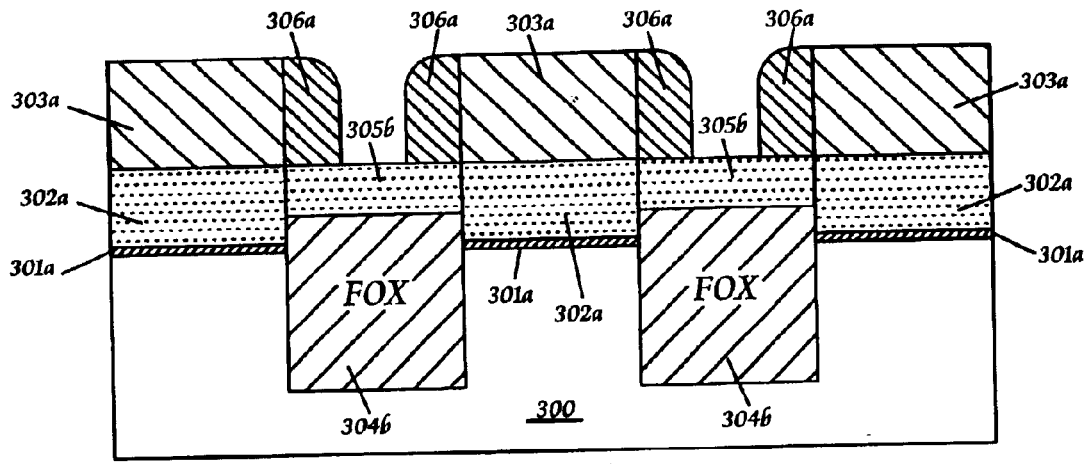

FIG. 3D shows that a planarized second conductive layer 305a is formed over each gap between the patterned first masking dielectric layers 303a and is etched back to a top surface level of the patterned first conductive layer 302a to form an etched-back second conductive layer 305b over each of the first raised field-oxide layers 304b; and a pair of first sidewall dielectric spacers 306a are formed over sidewalls of nearby patterned first masking dielectric layers 303a in each of the plurality of STI regions. The planarized second conductive layer 305a is preferably made of doped polycrystalline-silicon or doped amorphous-silicon as deposited by LPCVD and is formed by first depositing a thick second conductive layer 305 to fill up each gap formed between the patterned first masking dielectric layer 303a and then planarizing the deposited second conductive layer 305 using CMP with the patterned first masking dielectric layer 303a as a polishing stop. The first sidewall dielectric spacer 306a is preferably made of silicon-nitride as deposited by LPCVD and is formed by first depositing a first dielectric layer 306 and then etching back a thickness of the deposited first dielectric layer 306. It is clearly seen that the spacer width of the first sidewall dielectric spacer 306a is equal to the thickness of the deposited first dielectric layer 306 and is therefore controllable.

Figure 3E:
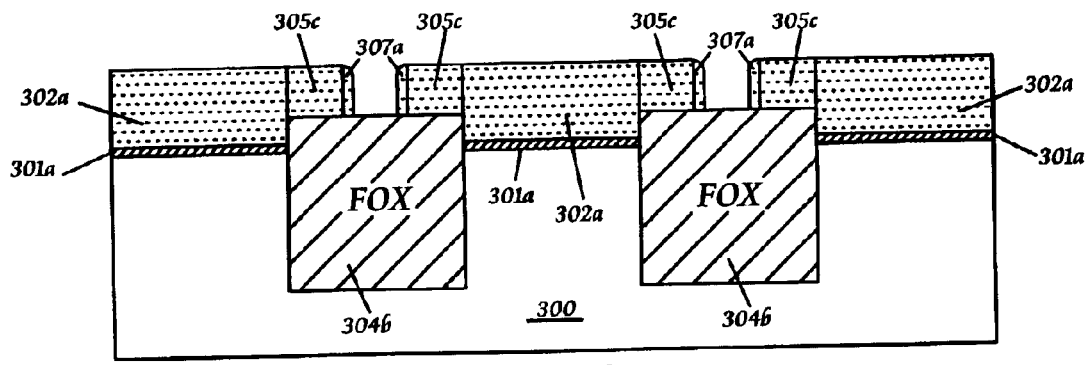

FIG. 3E shows that the etched-back second conductive layer 305b between the pair of first sidewall dielectric spacers 306a in each of the plurality of STI regions are anisotropically removed to form extended second conductive layers 305c; the patterned first masking dielectric layers 303a and the first sidewall dielectric spacers 306a are then removed by hot phosphoric acid; and a pair of thin sidewall conductive spacers 307a are formed over sidewalls of the extended second conductive layers 305c in each of the plurality of STI regions. The thin sidewall conductive spacer 307a is preferably made of doped polycrystalline-silicon or doped amorphous-silicon as deposited by LPCVD and is formed by first depositing a thin conductive layer 307 over a formed structure surface and then etching back a thickness of the deposited thin conductive layer 307. It is clearly seen that the thin sidewall conductive spacer 307a is mainly used to smooth the sharp corners produced by the extended second conductive layers 305c.

Figure 3F:
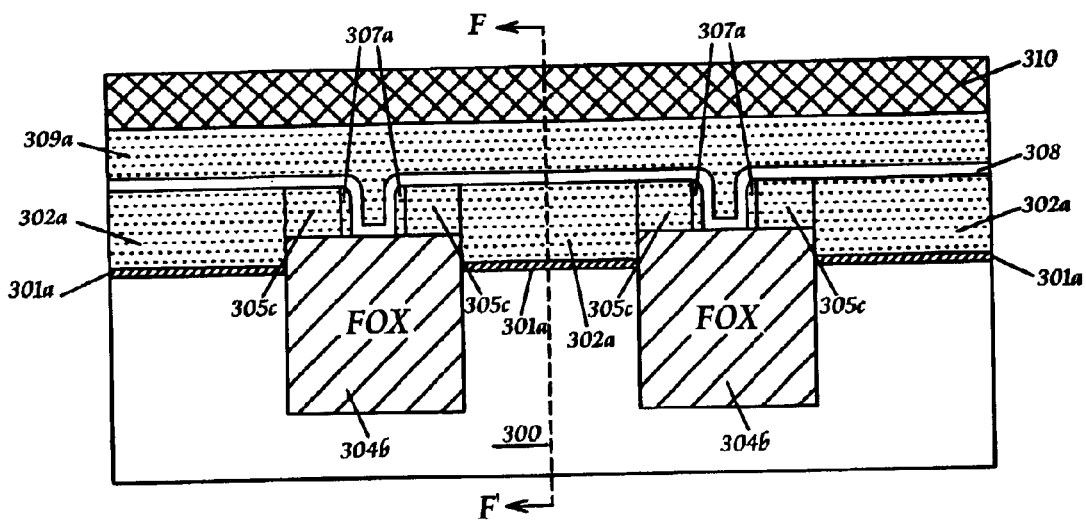

FIG. 3F shows that an intergate-dielectric layer 308 is formed over a formed structure surface shown in FIG. 3E; a planarized third conductive layer 309a is then formed over the intergate-dielectric layer 308; and subsequently, a first capping conductive layer 310 is formed over the planarized third conductive layer 309a. The intergate-dielectric layer 308 is preferably an oxide-nitride-oxide (ONO) structure or a nitride-oxide (NO) structure and its equivalent oxide thickness is preferably between 60 Angstroms and 200 Angstroms. The planarized third conductive layer 309a is preferably made of doped polycrystalline-silicon or doped amorphous-silicon as deposited by LPCVD and its thickness is preferably between 1000 Angstroms and 3000 Angstroms, and is formed by first depositing a third conductive layer 309 over the intergate-dielectric layer 308 and then planarizing the deposited third conductive layer 309 using CMP or a conventional etch-back technique. The first capping conductive layer 310 is preferably made of tungsten-disilicide ($WSi_2$) or tungsten (W) as deposited by LPCVD or sputtering and its thickness is preferably between 1500 Angstroms and 4000 Angstroms. It is clearly seen that one masking photoresist step (PRI) is required to form a self-aligned floating-gate structure with a high coupling ratio as compared to two masking photoresist steps used by the prior arts to form a non-self-aligned floating-gate structure and the sharp corners of the extended floating-gate layers 305c are smoothed by using thin sidewall conductive spacers 307a to eliminate the field-emission effect and to alleviate the reliability problem of the intergate-dielectric layer 308. The cross-sectional view along each of the plurality of active regions (AA) as indicated by a F–F' line shown in FIG. 3F is shown in FIG. 4A. It should be noted that FIG. 3A through FIG. 3F show only one example of forming a self-aligned floating-gate structure with a high coupling ratio. Several modified methods can be used to form a self-aligned floating-gate structure by using only one masking photoresist step. The first example (not shown) is that the planarized second conductive layers 305a as shown in FIG. 3D are etched back to a depth smaller than a thickness of the patterned first masking dielectric layer 303a to form an etched-back second conductive layer 305b with a top surface level higher than that of the patterned first conductive layer 302a. The second example (not shown) is that a pair of sidewall conductive spacers are formed over sidewalls of the etched-back cavity in each of the plurality of STI regions shown in FIG. 3C instead of forming the etched-back second conductive layers 305b and the first sidewall dielectric spacers 306a shown in FIG. 3D; the patterned first masking dielectric layers 303a are then removed, and then the processes shown in FIG. 3E and FIG. 3F are followed.

Referring now to FIG. 4A through FIG. 4H, there are shown the process steps and their cross-sectional views of forming a contactless NAND-type flash memory array of the present invention after forming a self-aligned floating-gate structure shown in FIG. 3F, in which a stacked-gate cell structure having a tapered floating-gate layer as shown in FIG. 2A and FIG. 2B is used as a memory cell.

FIG. 4A shows that a second masking dielectric layer 311 is formed over the first capping conductive layer 310 of the gate-stack structure shown in FIG. 3F. It should be emphasized that the second masking dielectric layer 311 can be formed over other gate-stack structures with a self-aligned floating-gate structure of a high coupling ratio or other non-self-aligned floating-gate structure of the prior arts. The second masking dielectric layer 311 is preferably made of silicon-nitride as deposited by LPCVD and its thickness is preferably between 5000 Angstroms and 10000 Angstroms. It should be noted that a thin silicon-dioxide layer (not shown) can be formed over the first capping conductive layer 310 to improve the adhesion of the second masking dielectric layer 311 over the first capping conductive layer 310.

Figure 5A:
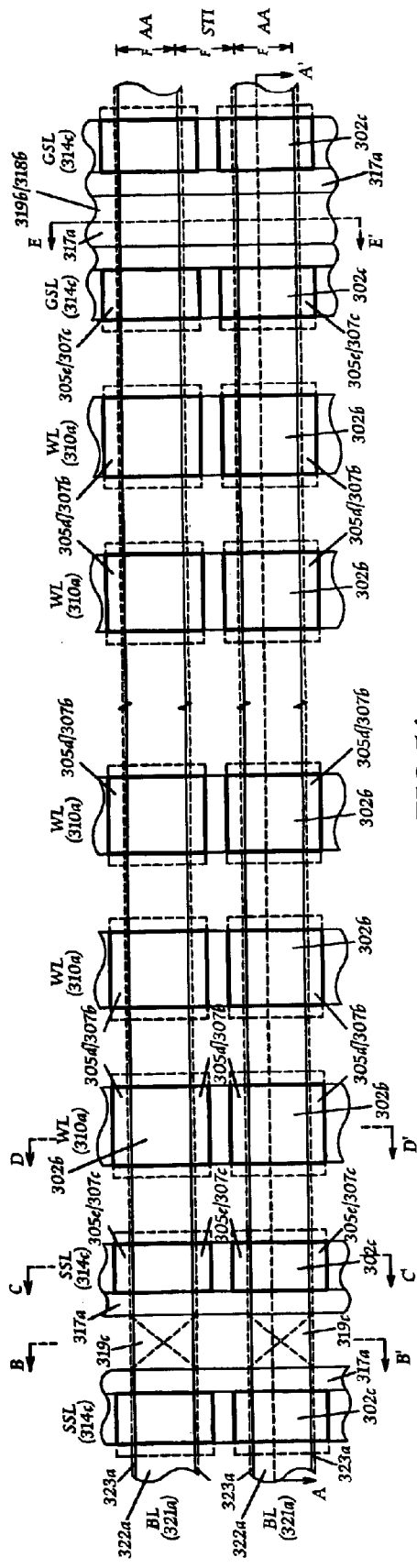
Figure 5C:
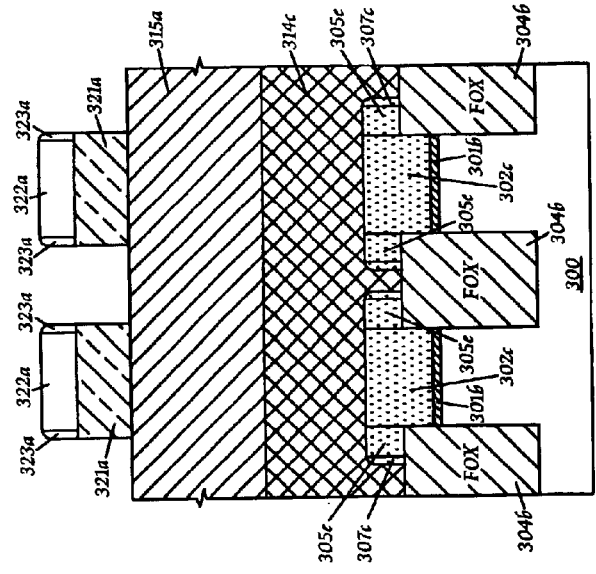

FIG. 4B shows that a plurality of interconnect source/drain regions (ISD) are patterned alternately to form a plurality of gate-stack rails (GS), in which each of the plurality of gate-stack rails (GS) comprising a patterned second masking dielectric layer 311a, a composite control-gate layer 310a/309b being acted as a word line (WL), a patterned intergate-dielectric layer 308a, and a plurality of tapered floating-gate layers 302b, 307b, 305d (307b and 305d are shown in FIG. 5C); a plurality of interconnect source/drain diffusion regions 312a are formed in a self-aligned manner by implanting a high dose of doping impurities across the formed tapered floating-gate structure and the tunneling-dielectric layer 301a into the semiconductor substrate 300 in the plurality of active regions (AA); and a first planarized oxide layer 313a is formed over each gap formed in the plurality of interconnect source/drain regions (ISD). The semiconductor substrate 300 comprises a p-well 300b being formed over an n-well 300a as shown in FIG. 2A and FIG. 2B. The taper angle θ of the tapered floating-gate layer 302b–307b–305d is preferably between 90 degrees and 60 degrees. The doping impurities formed in each of the plurality of interconnect source/drain diffusion regions 312a are preferably arsenic or phosphorous and the implant dose is between $10^{15}/cm^2$ and $5 \times 10^{15}/cm^2$. It is clearly seen that the doping profile formed in each of the plurality of interconnect source/drain diffusion regions 312a will be laterally graded and the width of the laterally graded interconnect source/drain diffusion regions 312a can be controlled by the implant energy. The first planarized oxide layer 313a is preferably made of silicon-dioxide, P-glass, or BP-glass as deposited by LPCVD, HDPCVD or PECVD, and is formed by first depositing a thick oxide layer 313 to fill up each gap formed between the patterned second masking dielectric layers 311a and then planarizing the deposited thick oxide layer 313 using CMP with the patterned second masking dielectric layer 311a as a polishing stop. It should be noted that a thermal oxidation can be performed before forming the first planarized oxide layers 313a to form a thin silicon-dioxide layer over sidewalls of the gate-stacks including the tapered floating-gate layer 302b, 305d, 307b. The width of the interconnect source/drain regions (ISD) and the width of the gate-stack rails (GS) can be defined to a minimum feature size (F) of technology used; the string select region (SSR) and the ground select region (GSR) can be defined to be $\chi_1 F$ and $\chi_2 F$, respectively, where $\chi_1$ and $\chi_2$ are the scaling factors and are preferably between 2 and 4. The string select region (SSR) comprises two string select-gate regions (SSG) and a common-drain region (CDR) being formed between two string select-gate regions (SSG). The ground select region (GSR) comprises two ground select-gate regions (GSG) and a common-source region (CSR) being formed between two ground select-gate regions (GSG). It should be noted that a cell string region is located between the string select region and the ground select region and comprises a plurality of cell strings, wherein each of the plurality of cell strings may have 16, 32 or more stacked-gate cells in series.

FIG. 4C shows that the patterned second masking dielectric layers 311a, the patterned first capping conductive layers 310a, the patterned planarized third conductive layers 309b, and the patterned intergate-dielectric layers 308a over the string select regions (SSR) and the ground select regions (GSR) are selectively and sequentially removed by using a non-critical masking photoresist PR3 being formed over each major portion of cell strings as an etching mask; ion implantation can be performed in a self-aligned manner by implanting doping impurities of the first conductivity type across the patterned first conductive layer 302b and the tunneling-dielectric layer 301a into the semiconductor substrate 300 in each of the plurality of active regions in the string select regions (SSR) and the ground select regions (GSR) to form the implant regions (not shown); and the masking photoresist PR3 are then stripped. Each of the implant regions comprises a shallow implant region for threshold-voltage adjustment and a deep implant region for forming a punch-through stop of the select-gate transistors in the string select regions (SSR) and the ground select regions (GSR). The implanted doping impurities are preferably boron or boron-fluoride impurities.

FIG. 4D shows that an etched-back second capping conductive layer 314b is formed in each of the string select regions (SSR) and each of the ground select regions (GSR); and a pair of second sidewall dielectric spacers 315a are formed over sidewalls of nearby first planarized oxide layers 313a and on a portion of the etched-back second capping conductive layer 314b in each of the string select regions (SSR) and each of the ground select regions (GSR) to define a pair of string select lines (SSL) 314c in each of the string select regions (SSR) and a pair of ground select lines (GSL) 314c in each of the ground select regions (GSR). The etched-back second capping conductive layer 314b is preferably made of tungsten-disilicide (WSi$_2$) or tungsten (W) as deposited by LPCVD or sputtering and is formed by first depositing a thick second capping conductive layer 314 over each gap in the string select regions (SSR) and the ground select regions (GSR) and then planarizing the deposited thick second capping conductive layer 314 by using CMP with the patterned second masking dielectric layer 311a as a polishing stop to form planarized second capping conductive layer 314a, and subsequently etching back said planarized second capping conductive layer 314a to a depth approximately equal to a top surface level of said patterned first capping conductive layer 310a. The second sidewall dielectric spacer 315a is preferably made of silicon-nitride as deposited by LPCVD and is formed by first depositing a second dielectric layer 315 over a formed structure surface and then etching back a thickness of the deposited second dielectric layer 315.

FIG. 4E shows that a non-critical masking photoresist step is performed to form a masking photoresist PR4 over each of cell strings and a portion of the second sidewall dielectric spacers 315a; the etched-back second capping conductive layer 314b between the pair of second sidewall dielectric spacers 315a in each of the string select regions (SSR) and each of the ground select regions (GSR) is first removed, the extended second conductive layers 305c and the thin sidewall conductive spacers 307a are anisotropically removed and the patterned first conductive layers 302b are etched back to a top surface level of the first raised field-oxide layers 304b (see FIG. 3E for reference), the first raised field-oxide layers 304b are then etched back to a top surface level of the tunneling-dielectric layer 301a to form second raised field-oxide layers 304c, and the remained patterned first conductive layers 302b are then removed; and subsequently, ion implantation is performed in a self-aligned manner to form a plurality of lightly-doped common-drain diffusion regions 316a in the semiconductor substrate 300 between the pair of second sidewall dielectric spacers 315a in each of the string select regions (SSR) and a plurality of lightly-doped common-source diffusion regions 316a in the semiconductor substrate 300 between the pair of second sidewall dielectric spacers 315a in each of the ground select regions (GSR). The implanted impurities are preferably phosphorous or arsenic and the implanted dose is between $10^{13}/cm^2$ and $5\times10^{14}/cm^2$. From FIG. 4E, it is clearly seen that the width of the string/ground select lines 314c is defined by the spacer width of the second sidewall dielectric spacer 315a and the select-gate layer 302c, 305e, 307c becomes a one-side tapered structure having a larger channel length and a narrower string/ground select line SSL/GSL.

FIG. 4F shows that the masking photoresist PR4 are stripped and a pair of third sidewall dielectric spacers 317a are formed over sidewalls of the pair of second sidewall dielectric spacers 315a, the string/ground select lines 314c, and the select-gate layers 302c, 305e, 307c and on a portion of a flat surface being alternately formed by the tunneling-dielectric layer 301a and the second raised field-oxide layer 304c in each of the common-source/drain regions, ion-implantation is then performed in a self-aligned manner by implanting a high dose of doping impurities across the tunneling-dielectric layers 301a into the semiconductor substrate 300 of the active regions to form a heavily-doped common-source/drain diffusion region 316b within each of the lightly-doped common-source/drain diffusion regions 316a, the tunneling-dielectric layers 301a between the pair of third sidewall dielectric spacers 317a are removed by anisotropic dry etching or dipping in a dilute hydrofluoric acid and the second raised field-oxide layers 304c are simultaneously etched to form third raised field-oxide layers 304d; and subsequently, a planarized fourth conductive layer 318a is formed over each gap between the pair of third sidewall dielectric spacers 317a. The third sidewall dielectric spacer 317a is preferably made of silicon-dioxide as deposited by LPCVD and is formed by first depositing a third dielectric layer 317 over a formed structure surface and then etching back a thickness of the deposited third dielectric layer 317. The planarized fourth conductive layer 318a is preferably made of doped polycrystalline-silicon as deposited by LPCVD and is formed by first depositing a thick fourth conductive layer 318 to fill up each gap between the pair of third sidewall dielectric spacers 317a and then planarizing the deposited thick fourth conductive layer 318 using CMP with the patterned second masking dielectric layer 311a as a polishing stop. The implanted doping impurities in the heavily-doped source/drain diffusion regions 316b are preferably arsenic or phosphorous and the implanted dose is preferably between $10^{15}/cm^2$ and $5 \times 10^{15}/cm^2$.

FIG. 4G shows that the planarized fourth conductive layers 318a in each of the common-source/drain regions are selectively etched back to a predetermined thickness and a high dose of arsenic impurities is implanted into etched-back planarized fourth conductive layers 318b in a self-aligned manner; a planarized third capping conductive layer 319a is formed over each gap between the pair of third sidewall dielectric spacers 317a; the planarized third capping conductive layers 319a in the common-source regions are selectively etched-back to another predetermined depth to form common-source conductive bus lines 319b/318b by using a non-critical masking photoresist step PR5 (not shown), wherein the masking photoresist PR5 are at least formed over the common-drain regions; the masking photoresist PR5 are stripped and a second planarized capping-oxide layer 320a is formed over each of the common-source conductive bus lines 319b/318b. The planarized third capping conductive layer 319a is preferably made of tungsten-disilicide ($WSi_2$) or tungsten (W) as deposited by LPCVD or sputtering and is formed by first depositing a thick third capping conductive layer 319 to fill up each gap in the common-source/drain regions and then planarizing the deposited thick third capping conductive layer 319 by using CMI) with the patterned second masking dielectric layer 311a as a polishing stop. The second planarized capping oxide layer 320a is preferably made of silicon-dioxide, P-glass, or BP-glass as deposited by LPCVD, HDPCVD, or PECVD and is formed by first depositing a thick oxide layer 320 to fill up each gap in the common-source regions and then planarizing the deposited thick oxide layer 320 by using CMN with the patterned second masking dielectric layer 311a as a polishing stop.

FIG. 4H shows that a metal layer 321 is formed over a formed structure surface shown in FIG. 4G and is simultaneously patterned with the planarized third capping conductive layers 319a over the etched-back fourth conductive layers 318b to form a plurality of metal bit lines 321a integrated with the planarized common-drain conductive islands 319c/318c by using a masking photoresist step PR6 (not shown). The metal layer 321 comprises an aluminum or copper layer over a barrier-metal layer. The masking photoresist step (PR6) comprises a plurality of third masking dielectric layers 322a being patterned by the mask photoresist PR6 and aligned above the plurality of active regions (AA) and a fourth sidewall dielectric spacer 323a being formed over each sidewall of the plurality of third masking dielectric layers 322a to reduce misalignment, as will be shown in FIG. 5B through FIG. 5E.

From FIG. 3A through FIG. 3F and FIG. 4A through FIG. 4H, three critical masking photoresist steps (PR1, PR2 and PR6) are required to form a contactless NAND-type flash memory array of the present invention as compared to at least six critical masking steps used in the prior art.

Figure 5B:
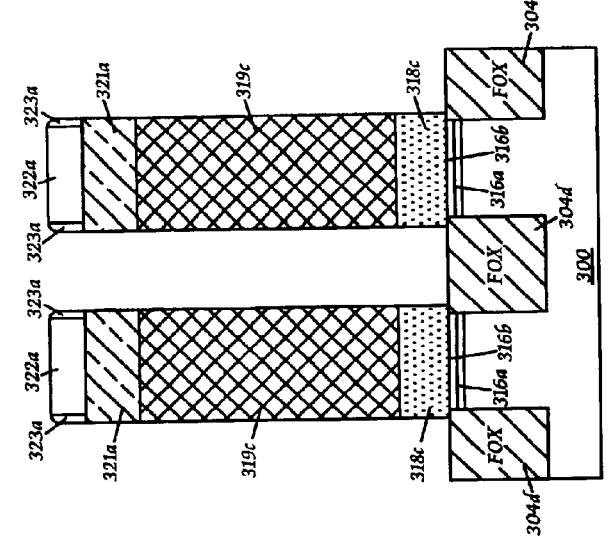
Figure 5E:
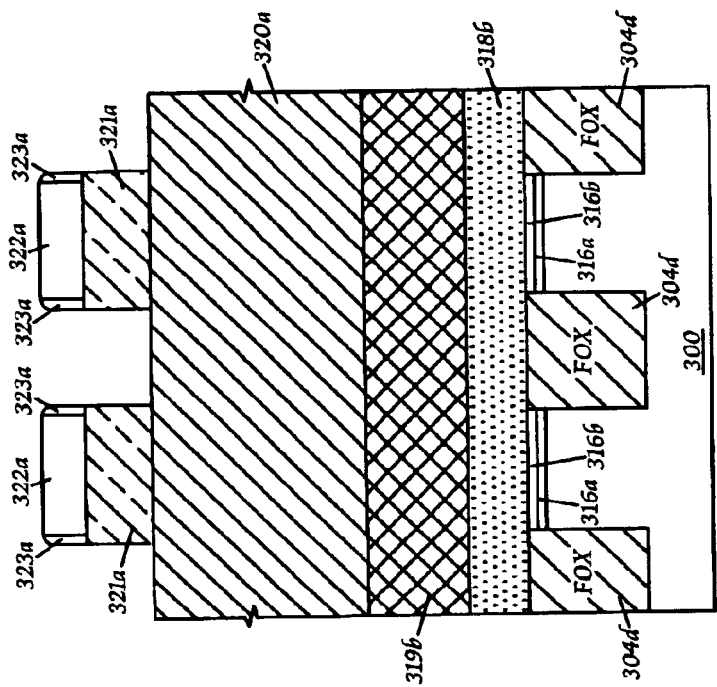
Figure 5D:
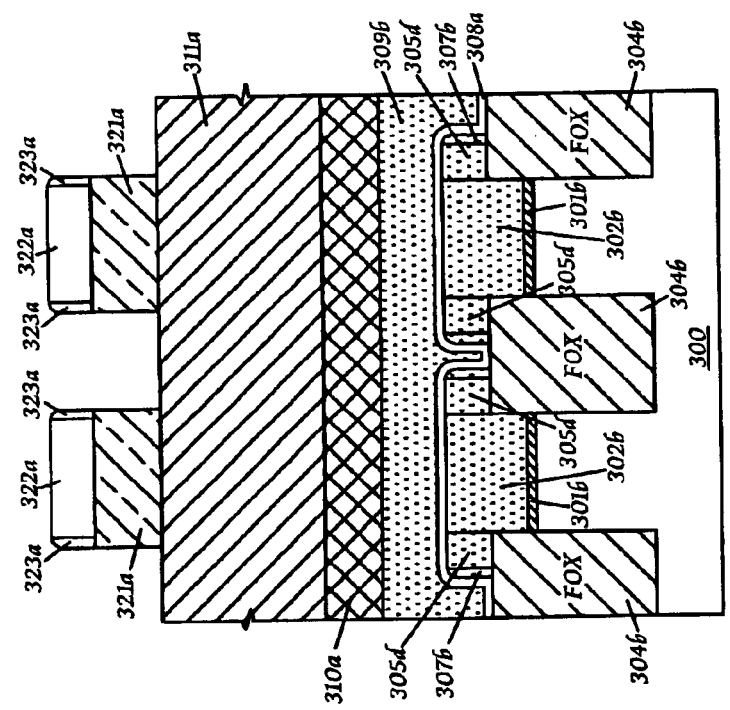

Referring now to FIG. 5A, there is shown a schematic top plan view of a contactless NAND-type flash memory array of the present invention, in which a cross-sectional view as indicated by a A–A' line is shown in FIG. 4H; a cross-sectional view along a B–B' line is shown in FIG. 5B; a cross-sectional view along a C–C' line is shown in FIG. 5C; a cross-sectional view along a D–D' line is shown in FIG. 5D; and a cross-sectional view along a E–E' line is shown in FIG. 5E.

FIG. 5A shows that the active regions (AA) and the STI regions (STI) are formed alternately; a plurality of word lines (WL) are formed transversely to the active regions (AA), wherein each of the plurality of word lines (WL) comprises a composite control-gate layer 310a/309b being formed above a plurality of self-aligned floating-gate layers 302b, 305d, 307b as shown in FIG. 5D and each of the plurality of self-aligned floating-gate layers 302b, 305d, 307b has a tapered floating-gate structure as masked by the dash lines; a pair of string select lines (SSL) 314c and a pair of ground select lines (GSL) 314c being located at each side of cell strings, wherein each of the pair of string/ground select lines 314c comprises a plurality of one-side tapered floating gates 302c, 305e, 307c as shown in FIG. 5C; a plurality of planarized common-drain conductive islands 319c/318c being formed between the pair of third sidewall dielectric spacers 317a and on the common-drain diffusion regions 316b/316a are simultaneously patterned with a plurality of metal bit lines 321a, wherein each of the plurality of metal bit lines 321a is patterned by a third masking dielectric layer 322a being aligned above the active region (AA) and a fourth sidewall dielectric spacer 323a being formed over each sidewall of the third masking dielectric layer 322a as shown in FIG. 5B; and a common-source conductive bus line 319b/318b is formed over a first flat bed between the pair of third sidewall dielectric spacers 317a, wherein the first flat bed is alternately formed by a common-source diffusion region 316b/316a and a third raised field-oxide layer 304d as shown in FIG. 5E.

FIG. 5B shows a cross-sectional view along the planarized common-drain conductive islands 319c/318c as indicated by a B–B' line shown in FIG. 5A, in which each of the metal bit lines 321a being integrated with the planarized common-drain conductive islands 319c/318c is patterned by a third masking dielectric layer 322a being aligned above the active region (AA) and a fourth sidewall dielectric spacer 323a being formed over each sidewall of the third masking dielectric layer 322a to reduce misalignment; and each of the planarized common-drain conductive islands 319c/318c is at least formed over the common-drain diffusion region 316b/316a having a heavily-doped common-drain diffusion region 316b formed within a lightly-doped common-drain diffusion region 316a; and a second flat bed is alternately formed by the heavily-doped common-drain diffusion region 316b and a third raised field-oxide layer 304d.

FIG. 5C shows a cross-sectional view along a string select line (SSL) 310c as indicated by a C–C' line shown in FIG. 5A, in which the string select line (SSL) 314c is formed over a surface being alternately formed by a self-aligned floating-gate layer 302c, 305e, 307c and a first raised field-oxide layer 304b; a second sidewall dielectric spacer 315a is formed over the string select line 314c to define the width of the string select line (SSL) 314c; the metal bit lines 321a are formed over the second sidewall dielectric spacer 315a and are patterning by the masking photoresist step (PR6) as described; and each of the string select-gates 302c is formed over a tunneling-dielectric layer 301b between nearby first raised field-oxide layers 304b. It is clearly seen that the string select line 314c is integrated with MOS transistor gates as compared to flash memory devices of the prior art.

FIG. 5D shows a cross-sectional view along a word line (WL) as indicated by a D–D' line shown in FIG. 5A, in which a self-aligned floating-gate structure with a high coupling ratio is formed over the STI structure as described in FIG. 3F; a patterned second masking dielectric layer 311a is formed over the composite control-gate layer 310a/309b;

and the metal bit lines 321a are formed over the patterned second masking dielectric layer 311a and are patterned by the masking photoresist step (PR6) as described.

FIG. 5E shows a cross-sectional view along a common-source conductive bus line 319b/318b as indicated by a E–E' line shown in FIG. 5A, in which the common-source conductive bus line 319b/318b is formed over a first flat bed being alternately formed by a third raised field-oxide layer 304d and a common-source diffusion region 316b/316a, wherein the common-source diffusion region 316b/316a comprises a heavily-doped common-source diffusion region 316b being formed within a lightly-doped common-source diffusion region 316a; a second planarized capping oxide layer 320a is formed over the common-source conductive bus line 319b/318b; similarly, the metal bit lines 321a are formed over the second planarized capping oxide layer 320a and are patterned by the masking photoresist step (PR6) as described. It is clearly seen that the common-source conductive bus line 319b/318b offers lower bus-line resistance and lower bus-line capacitance with respect to the semiconductor substrate 300 as compared to the buried diffusion bus line of the prior art.

Accordingly, the features and the advantages of the stacked-gate cell structure and its contactless NAND-type flash memory array of the present invention can be summarized as follows:

(a) The stacked-gate cell structure of the present invention having a self-aligned floating-gate structure offers a high coupling ratio and a smoothed floating-gate layer to alleviate the corner field emission effect and the reliability problem in high-voltage operation of a NAND-type array.

(b) The stacked-gate cell structure of the present invention having a tapered floating-gate structure offers a larger surface area for programming and erasing based on Fowler-Nordheim tunneling for a scaled control-gate width, a high speed erasing through the tapered tips, and a laterally graded doping profile for interconnect common-source/drain diffusion regions to reduce parasitic series resistance of the interconnect source/drain diffusion regions.

(c) The width of the string/ground select lines of the present invention being defined by a spacer formation technique can be made to be smaller than a minimum feature size of technology used and the select-gate length of the select-gate transistors can be made to be larger than the minimum features size of technology used through a one-side tapered floating-gate structure.

(d) The common-source conductive bus line of the present invention is formed over a first flat bed being alternately formed by a common-source diffusion region and a third raised field-oxide layer and can offer a lower bus-line resistance and a lower bus-line capacitance with respect to the semiconductor substrate as compared to the buried diffusion line of the prior art.

(e) The bit-line contact of the present invention is formed by a contactless technique and offers not only a larger contact area but also a higher contact integrity for a scaled contact technology.

(f) The contactless NAND-type flash memory array of the present invention can be fabricated with fewer critical masking photoresist steps and offers smaller unit cell size as compared to the prior art.

While the present invention has been particularly shown and described with reference to the present examples and embodiments as considered as illustrative and not restrictive. Moreover, the present invention is not to be limited to the details given herein, it will be understood by those skilled in the art that various changes in forms and details may be made without departure from the true spirit and scope of the present invention.

What is claimed is:

1. A stacked-gate cell structure for a NAND-type flash memory array, comprising:

a semiconductor substrate of a first conductivity type having an active region formed between two shallow trench isolation (STI) regions;

a gate stack being formed over said semiconductor substrate, wherein said gate stack comprises a composite control-gate layer being formed over an intergate-dielectric layer, said intergate-dielectric layer being formed over a tapered floating-gate layer and central portions of two first raised field-oxide layers in said two STI regions, said tapered floating-gate layer having a major portion formed over a tunneling-dielectric layer in said active region and two extended portions formed over side portions of said two first raised field-oxide layers in said two STI regions; and a laterally graded interconnect source/drain diffusion region of a second conductivity type being formed by implanting a high dose of doping impurities into said semiconductor substrate of said active region in a self-aligned manner using said gate stack as all implantation mask.

2. The stacked-gate cell structure according to claim 1, wherein said semiconductor substrate is a p-well being formed within an n-well.

3. The stacked-gate cell structure according to claim 1, wherein said composite control-gate layer comprises a tungsten-disilicide ($WSi_2$) or tungsten (W) layer over a doped polycrystalline-silicon or doped amorphous-silicon layer.

4. The stacked-gate cell structure according to claim 1, wherein said intergate-dielectric layer is an oxide-nitride-oxide (ONO) structure or a nitride-oxide (NO) structure having an equivalent oxide thickness between 60 Angstroms and 200 Angstroms and said tunneling-dielectric layer is a thermal silicon-dioxide layer or a nitrided thermal silicon-dioxide layer having a thickness between 60 Angstroms and 120 Angstroms.

5. The stacked-gate cell structure according to claim 1, wherein said tapered floating-gate layer is made of doped polycrystalline-silicon or doped amorphous-silicon and is formed by anisotropic dry etching with a taper angle $\theta$ between 90 degrees and 60 degrees.

6. The stacked-gate cell structure according to claim 1, wherein said two extended portions of said tapered floating-gate layer are defined by first sidewall dielectric spacers being formed over sidewalls of said active region or are formed by sidewall conductive spacers being formed over sidewalls of said active region and thin sidewall conductive spacers are formed over sidewalls of said two extended portions to alleviate corner field-emission effects.

7. A contactless NAND-type flash memory array, comprising:

a semiconductor substrate of a first conductivity type having a plurality of active regions and a plurality or STI regions formed alternately;

a plurality of cell string regions being alternately formed over said semiconductor substrate, wherein each of the plurality of cell string regions being located between a string select region and a ground select region comprises a plurality of gate-stack rails and a plurality of interconnect source/drain regions being formed alternately;

each of the plurality of gate-stack rails comprising a patterned second masking dielectric layer being formed over a composite control-gate layer, said composite control-gate layer being formed over an intergate-dielectric layer, said intergate-dielectric layer being formed over a plurality of tapered floating-gate layers and first raised field-oxide layers between nearby tapered floating-gate layers, and the plurality of tapered floating-gate layers being formed over tunneling-dielectric layers in the plurality of active regions and portions of said first raised field-oxide layers in the plurality of STI regions, wherein each of the plurality of tapered floating-gate layers comprises a major portion being formed over said tunneling-dielectric layer and two extended portions being separately formed over portions of nearby two first raised field-oxide layers;

each of the plurality of interconnect source/drain regions comprising a plurality of interconnect source/drain diffusion regions of a second conductive type being formed in said semiconductor substrate in a self-aligned manner by implanting a high dose of doping impurities across said tunneling-dielectric layer and tapered portions of said tapered floating-gate layers to form a laterally graded doping profile for each of the plurality of interconnect source/drain diffusion regions and a first planarized capping oxide layer being formed between nearby patterned second masking dielectric layers;

said ground select region comprising a pair of ground select-gate regions being defined by a pair of second sidewall dielectric spacers and a common-source region being formed between said pair of ground select-gate regions, wherein each of said pair of ground select-gate regions comprises a ground select line being formed over a plurality of one-sided tapered floating-gate layers and said first raised field-oxide layers between nearby one-side tapered floating-gate layers and the plurality of one-sided tapered floating-gate layers being formed over said tunneling-dielectric layers in the plurality of active regions and portions of said first raised field-oxide layers in the plurality of STI regions;

said common-source region comprising a plurality of lightly-doped common-source diffusion regions of said second conductivity type being formed in said semiconductor substrate of the plurality of active regions, a pair of third sidewall dielectric spacers being formed over sidewalls of said pair of ground select-gate regions and on a flat surface being alternately formed by said tunneling-dielectric layer and a second raised field-oxide layer, a common-source conductive bus line being formed over a first flat bed between said pair of third sidewall dielectric spacers, and a second planarized capping oxide layer being formed over each of said common-source conductive bus lines, wherein said first flat bed is alternately formed by a heavily-doped common-source diffusion region of said second conductivity type being formed within each of the plurality of lightly-doped common-source diffusion regions and a third raised field-oxide layer;

said string select region comprising a pair of string select-gate regions being defined by said pair of second sidewall dielectric spacers and a common-drain region being formed between said pair of string select-gate regions, wherein each of said pair of string select-gate regions comprises a string select line being formed over the plurality of one-side tapered floating-gate layers and said first raised field-oxide layers between nearby one-side tapered floating-gate layers and the plurality of one-side tapered floating-gate layers being formed over said tunneling-dielectric layers in the plurality of active regions and portions of said first raised field-oxide layers in the plurality of STI regions;

said common-drain region comprising a plurality of lightly-doped common-drain diffusion regions of said second conductivity type being formed in said semiconductor substrate of the plurality of active regions, said pair of third sidewall dielectric spacers being formed over sidewalls of said pair of string select-gate regions and on a flat surface being alternately formed by said tunneling-dielectric layer and said second raised field-oxide layer, and a plurality of planarized common-drain conductive islands being at least formed over a plurality of heavily-doped common-drain diffusion regions between said pair of third sidewall dielectric spacers, wherein each of the plurality of heavily-doped common-drain diffusion regions is formed within each of the plurality of lightly-doped common-drain diffusion regions; and a plurality of metal bit lines integrated with said planarized common-drain conductive islands being simultaneously patterned by a masking photoresist step, wherein said masking photoresist step comprises a plurality of third masking dielectric layers being aligned above the plurality of active regions and a fourth sidewall dielectric spacer being formed over each sidewall of the plurality of third masking dielectric layers.

8. The contactless NAND-type flash memory array according to claim 7, wherein said composite control-gate layer being acted as a word line comprises a tungsten-disilicide ($WSi_2$) or tungsten (W) layer being formed over a doped polycrystalline-silicon or doped amorphous-silicon layer.

9. The contactless NAND-type flash memory array according to claim 7, wherein said tapered floating-gate layer is made of doped polycrystalline-silicon or doped amorphous-silicon and is formed by anisotropic dry etching to have a taper angle $\theta$ between 90 degrees and 60 degrees.

10. The contactless NAND-type flash memory array according to claim 7, wherein said two extended portions of said tapered floating-gate layer are defined by first sidewall dielectric spacers being formed over sidewalls of said active region or are formed by sidewall conductive spacers being formed over sidewalls of said active region and thin sidewall conductive spacers are formed over sidewalls of said two extended portions to smooth sharp corners.

11. The contactless NAND-type flash memory array according to claim 7, wherein said string/ground select line comprises a tungsten-disilicide ($WSi_2$) or tungsten (W) layer and said one-side tapered floating-gate layer being made of doped polycrystalline-silicon or doped amorphous- silicon is formed by anisotropic dry etching to have a taper angle $\theta$ between 90 degrees and 60 degrees.

12. The contactless NAND-type flash memory array according to claim 7, wherein said common-source conductive bus line comprises a tungsten- disilicide ($WSi_2$) or tungsten (W) layer over a heavily-doped polycrystalline-silicon or heavily-doped amorphous-silicon layer.

13. The contactless NAND-type flash memory array according to claim 7, wherein said planarized common-drain conductive island comprises a tungsten-disilicide ($WSi_2$) or tungsten (W) island over a heavily-doped polycrystalline-silicon or heavily-doped amorphous-silicon island and said metal bit line comprises a copper or aluminum layer over a barrier-metal layer.

* * * * *